(12) United States Patent
Kim et al.

(10) Patent No.: US 11,455,520 B2
(45) Date of Patent: Sep. 27, 2022

(54) COPYING WEIGHTS BETWEEN RESISTIVE CROSS-POINT ARRAYS

(71) Applicant: INTERNATIONAL BUSINESS MACHINES CORPORATION, Armonk, NY (US)

(72) Inventors: Seyoung Kim, White Plains, NY (US); Tayfun Gokmen, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 775 days.

(21) Appl. No.: 16/441,831

(22) Filed: Jun. 14, 2019

(65) Prior Publication Data

US 2020/0394503 A1    Dec. 17, 2020

(51) Int. Cl.
*G11C 11/54* (2006.01)
*G06N 3/063* (2006.01)
*G06N 3/08* (2006.01)
*G06N 3/04* (2006.01)

(52) U.S. Cl.
CPC ........... *G06N 3/063* (2013.01); *G06N 3/0454* (2013.01); *G06N 3/084* (2013.01); *G11C 11/54* (2013.01)

(58) Field of Classification Search
CPC ... G11C 11/54; G11C 14/0045; G11C 14/009; G06N 3/063; G06N 3/054
See application file for complete search history.

(56) References Cited

U.S. PATENT DOCUMENTS

| | | | |
|---|---|---|---|
| 8,655,813 B2 | 2/2014 | Ananthanarayanan et al. | |
| 8,712,940 B2 | 4/2014 | Modha | |
| 8,924,322 B2 | 12/2014 | Datta et al. | |
| 9,767,407 B2 | 9/2017 | Cho et al. | |
| 9,852,790 B1 | 12/2017 | Gokmen et al. | |
| 10,453,528 B1 * | 10/2019 | Burr | G11C 13/003 |
| 10,832,773 B1 * | 11/2020 | Kim | G11C 7/16 |
| 2017/0109626 A1 | 4/2017 | Gokmen et al. | |
| 2018/0253642 A1 | 9/2018 | Gokmen et al. | |

OTHER PUBLICATIONS

Stefano Ambrogio et al., "Equivalent-accuracy accelerated neural-network training using analogue memory", Nature, Jun. 2018, vol. 558.

Tayfun Gokmen et al., "Acceleration of Deep Neural Network Training with Resistive Cross-Point Devices: Design Considerations", Frontiers in Neuroscience, Jul. 2018, vol. 10.

Wilfried Haensch et al., "The Next Generation of Deep Learning Hardware: Analog Computing", Proceedings of the IEEE, Jan. 2019, vol. 107.

* cited by examiner

*Primary Examiner* — Han Yang
(74) *Attorney, Agent, or Firm* — Tutunjian & Bitetto, P.C.; Randall Bluestone

(57) ABSTRACT

Methods and systems for copying weight values between weight arrays includes reading outputs from a first array and reading outputs from a second array. Differences between respective outputs of the first array and the second array are determined. Values of the second array are adjusted in accordance with the determined differences.

20 Claims, 6 Drawing Sheets

COPYING WEIGHTS BETWEEN RESISTIVE CROSS-POINT ARRAYS

BACKGROUND

The present invention generally relates to resistive cross-point arrays and, more particularly, to copying values between such arrays.

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There can be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

SUMMARY

A method for copying weight values between weight arrays includes reading outputs from a first array and reading outputs from a second array. Differences between respective outputs of the first array and the second array are determined using a processor. Values of the second array are adjusted in accordance with the determined differences.

A method for copying weight values between weight arrays includes reading outputs from a first array that has first weights implemented as respective resistive processing units and reading outputs from a second array that has second weights implemented as respective resistive processing units. Differences between respective outputs of the first array and the second array are determined using a processor. Vales of the second array are adjusted in accordance with the determined differences. The steps of reading outputs from the second array, determining differences, and adjusting values of the second array to iteratively decrease the differences between the outputs from the first array and the outputs from the second array are repeated.

A resistive processing unit system includes a first array of resistive processing units and a second array of resistive processing units. An array copy module is configured to reading outputs from the first array, to read outputs from the second array, to determine differences between respective outputs of the first array and the second array, and to adjust values of the second array in accordance with the determined differences.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide copying of values from one array of weights to another in, for example, an artificial neural network (ANN). The weights can be implemented in the form of a cross-point array of resistive processing units (RPU). Due to device variations and non-idealities in the peripheral circuits and parasitic elements, it can be challenging to replicate the value of a particular RPU from a first array to a similar RPU in a second array. The present embodiments use an iterative process to determine the differences between the values read from the first array and the values copied to the second array and to correct those differences, with the outputs of the second array converging to the outputs of the first array until any difference falls within some acceptable threshold.

Figure 1:
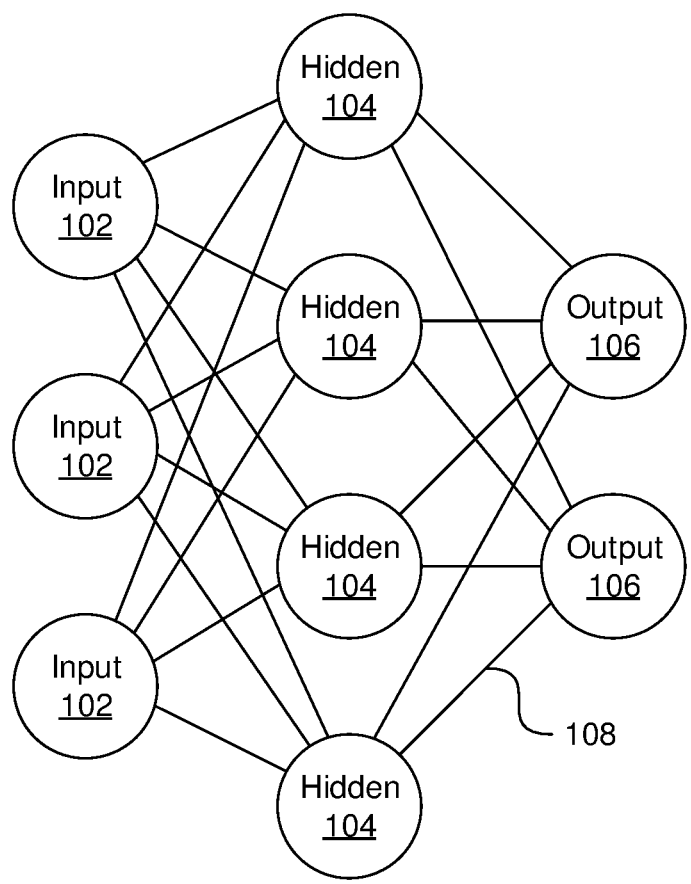
FIG. 1 is a diagram of a prior art artificial neural network.
Figure 2:
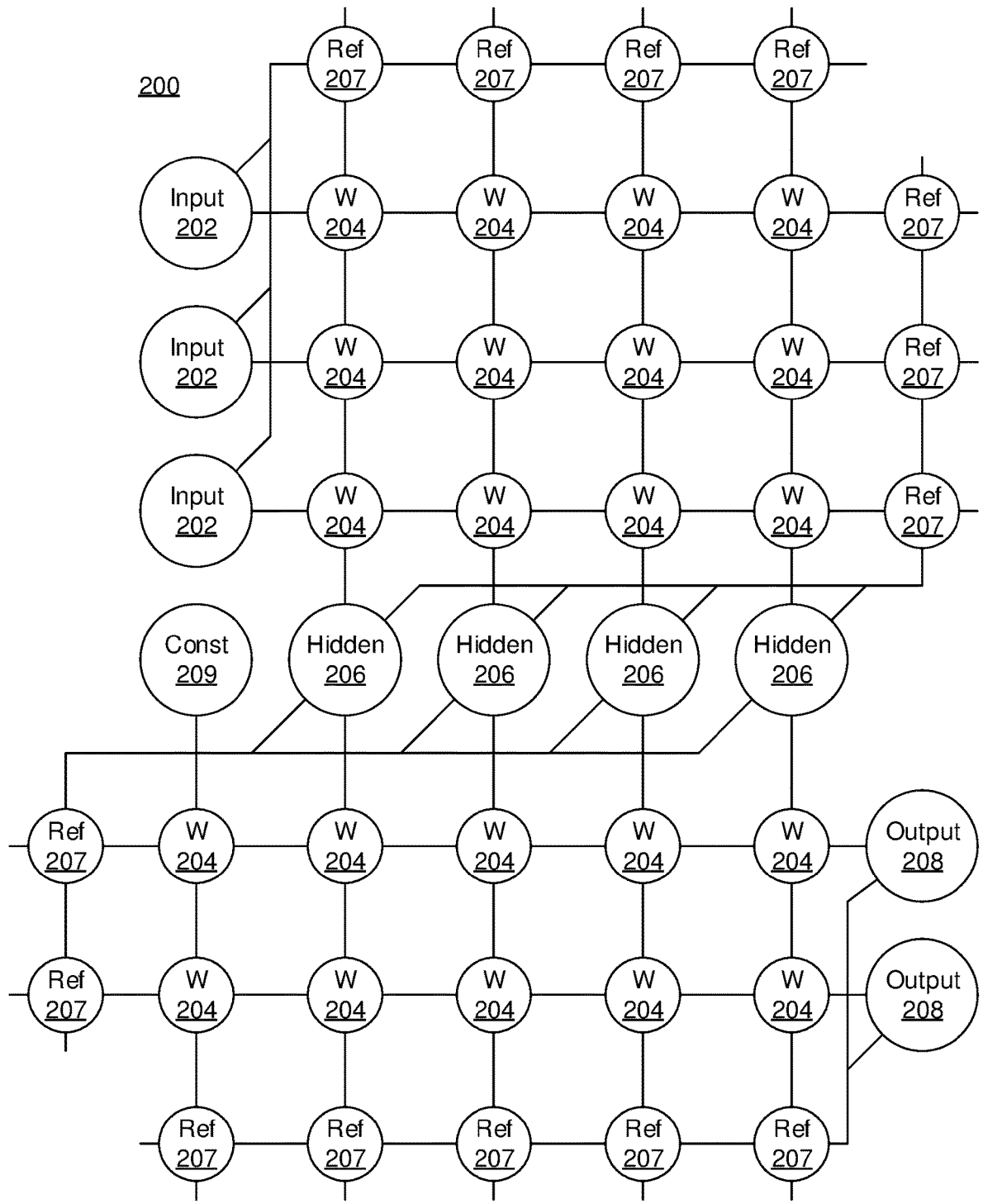
FIG. 2 is a diagram of an artificial neural network that uses crosspoint arrays of resistive processing units in accordance with an embodiment of the present invention.

Referring now to the drawings in which like numerals represent the same or similar elements and initially to FIG. 2, an artificial neural network (ANN) architecture 200 is shown. It should be understood that the present architecture is purely exemplary and that other architectures or types of neural network can be used instead. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, softmax layers, or any other appropriate type of neural network layer. Furthermore, layers can be added or removed as needed and the weights can be omitted for more complicated forms of interconnection.

During feed-forward operation, a set of input neurons 202 each provide an input voltage in parallel to a respective row of weights 204. In the hardware embodiment described herein, the weights 204 each have a settable resistance value, such that a current output flows from the weight 204 to a respective hidden neuron 206 to represent the weighted input. In software embodiments, the weights 204 can simply be represented as coefficient values that are multiplied against the relevant neuron outputs.

Following the hardware embodiment, the current output by a given weight 204 is determined as $I=V/r$, where V is the input voltage from the input neuron 202 and r is the set resistance of the weight 204. The current from each weight adds column-wise and flows to a hidden neuron 206. A set of reference weights 207 have a fixed resistance and combine their outputs into a reference current that is provided to each of the hidden neurons 206. Because conductance values can only be positive numbers, some reference conductance is needed to encode both positive and negative values in the matrix. The currents produced by the weights 204 are continuously valued and positive, and therefore the reference weights 207 are used to provide a reference current, above which currents are considered to have positive values and below which currents are considered to have negative values. The use of reference weights 207 is not needed in software embodiments, where the values of outputs and weights can be precisely and directly obtained. As an alternative to using the reference weights 207, another embodiment can use separate arrays of weights 204 to capture negative values.

The hidden neurons 206 use the currents from the array of weights 204 and the reference weights 207 to perform some calculation. The hidden neurons 206 then output a voltage of their own to another array of weights 204. This array performs in the same way, with a column of weights 204 receiving a voltage from their respective hidden neuron 206 to produce a weighted current output that adds row-wise and is provided to the output neuron 208.

It should be understood that any number of these stages can be implemented, by interposing additional layers of arrays and hidden neurons 206. It should also be noted that some neurons can be constant neurons 209, which provide a constant output to the array. The constant neurons 209 can be present among the input neurons 202 and/or hidden neurons 206 and are only used during feed-forward operation.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the input neurons 202 and hidden neurons 206 apply a first weight update voltage forward and the output neurons 208 and hidden neurons 206 apply a second weight update voltage backward through the network 200. The combinations of these voltages create a state change within each weight 204, causing the weight 204 to take on a new resistance value. In this manner the weights 204 can be trained to adapt the neural network 200 to errors in its processing. It should be noted that the three modes of operation, feed forward, back propagation, and weight update, do not overlap with one another.

It is particularly contemplated herein that the weights 204 can be implemented using resistive cross point devices. Such resistive devices can have switching characteristics that have a non-linearity that can be used for processing data. The weights 204 can belong to a class of device called RPUs. The RPU devices can be implemented with resistive random access memory (RRAM), phase change memory (PCM), programmable metallization cell (PMC) memory, or any other device that has appropriate resistive switching characteristics. Such RPU devices can also be considered as memristive systems.

Due to variations that occur in the fabrication process, as well as circuit parasitics and non-idealities in peripheral circuits, it is not generally possible to create two perfectly identical arrays of RPUs. Device variation is not a problem generally for ANNs, because any discrepancies between the intended resistance value and an expected resistance value are accounted for by the backpropagation and error correction processes, such that the output of the array network matches an intended value, regardless of what the actual resistance value of the RPUs happens to be. The present embodiments make use of this property to compensate for physical variations between two arrays when copying weights.

Figure 3:
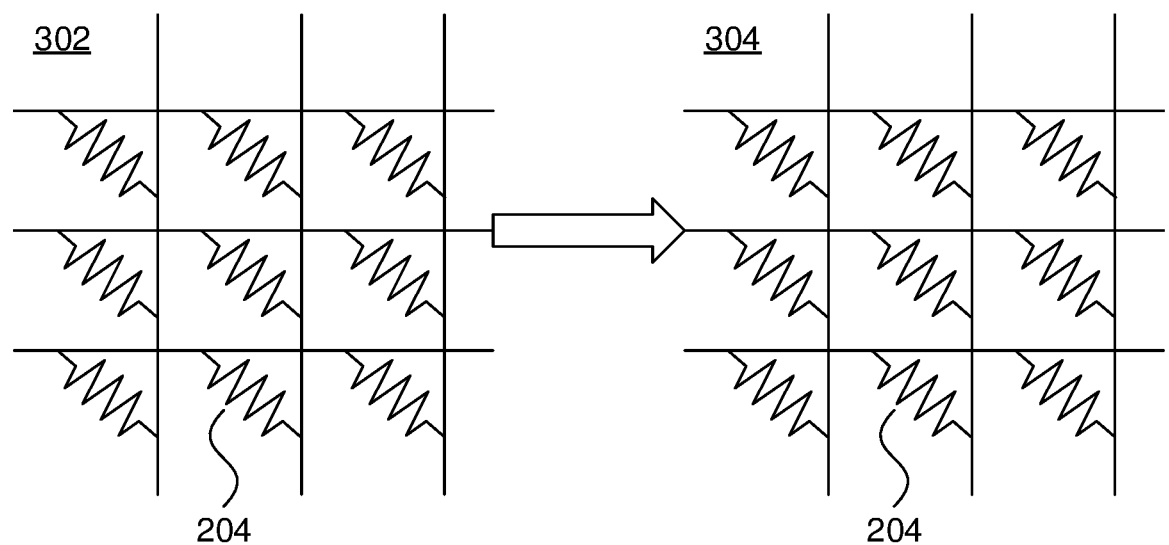
FIG. 3 is a schematic diagram of a copy operation between two different arrays of resistive processing units in accordance with an embodiment of the present invention.

Referring now to FIG. 3, a diagram shows a copy operation between RPU tiles, each of which can include an array of RPU devices and peripheral circuits. A first weight array 302, made up of individual RPUs 204, is programmed with a set of resistance values. These resistance values are set to provide particular current outputs when a voltage is applied. A second array 304 is initialized with zero values or random values. A copy operation takes the outputs of the first array 302 and adjusts the values of the weights 204 of the second array 304 so that the second array 304 produces the same outputs as the first array 302. Although 3×3 arrays are shown, it should be understood that arrays of any appropriate size can be used instead. In some embodiments, the first weight array 302 and the second weight array 304 can be weight arrays within a single neural network. In other embodiments, the first weight array 302 and the second weight array 304 can be weight arrays within different respective neural networks.

Performing this copy operation is challenging due to the variations in device characteristics that naturally result from random fluctuations during fabrication and due to circuit parasitics. Additionally, RPU arrays can intentionally be made with similar sizes, but different physical characteristics. Even if two RPU arrays were exactly the same, if the peripheral circuits differ, then the readings from the arrays will be different. Furthermore, temperature differences, vibrations, impurities, and other problems can cause otherwise identical devices to behave differently. Thus, corresponding weights 204 between the first array 302 and the second array 304 may have different set resistances, yet produce the same current output.

The naïve approach to copying the values of the first array 302 to the second array 304 is to simply read out the output currents from the first array 302, determine a resistance value for each weight 204 in the first array 302, and then attempt to program the respective resistance values of the corresponding weights 204 in the second array 304 with the determined resistance values. The device variations described above prevent the resistance values from the first array 302 from being accurately determined and furthermore prevent the same resistance values from being accurately replicated in the second array 304.

Figure 4:
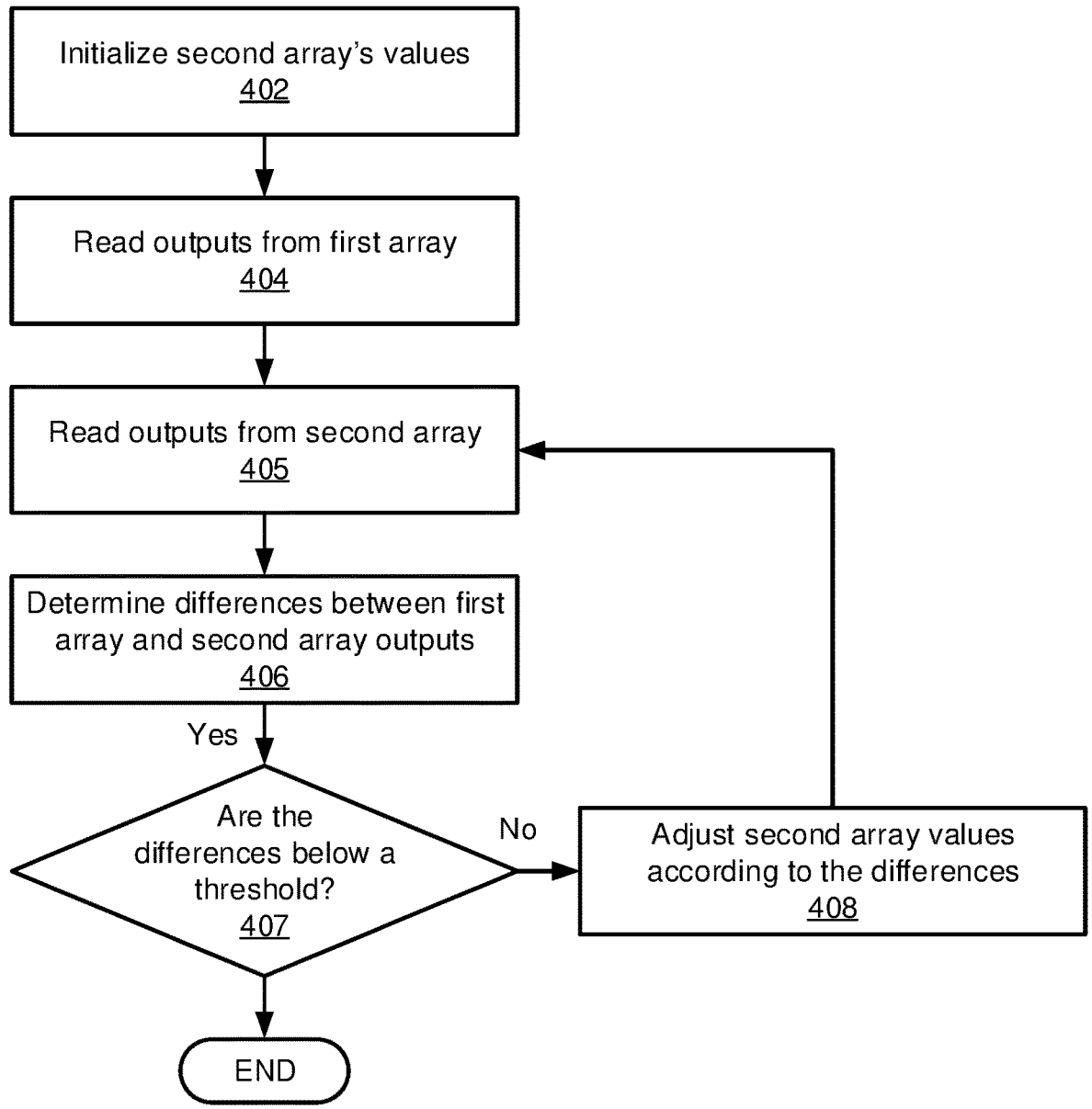
FIG. 4 is a block/flow diagram of a method for copying values from a first array of resistive processing units to a second array of resistive processing units that is not sensitive to device variation or circuit parasitics.

Referring now to FIG. 4, a method for copying values between RPU arrays is shown. Block 402 initializes the values of a second array 304. Although the second array 304 can be initialized to any value, it is specifically contemplated that the values can be initialized to zero. In other embodiments, for example where the second array 304 has been previously programmed, its previous values can be used as initial values in the copy operation.

Block 404 reads the outputs of the first array 302. For example, the outputs can be read out column by column to generate vectors that represent each column of values. Block 405 reads corresponding outputs of the second array 304 and block 406 compares the respective outputs to determine differences between the outputs of the two arrays. In some embodiments, the initialization step 402 can take place after the values of the first array 302 are read out. Block 402 can then initialize the values of the second array 304 to match the values of the first array 302 as closely as possible without having information regarding device variations and circuit parasitics. This initial setting can help decrease the time to convergence.

Block 407 determines whether the measured differences are below an acceptable threshold that indicates that the first array 302 has been successfully copied. If the differences are below the threshold, processing completes. If the differences are not below the threshold, block 408 adjusts the resistance values of the second array 304 according to the measured differences to bring the outputs of the second array 304 into accord with the outputs of the first array 302. In alternative embodiments, the comparison of block 406 is omitted and block 407 simply determines whether a maximum number of iterations have been completed.

In one particular embodiment, block 408 adjusts the resistance values of the RPUs according to:

$$RPU \leftarrow RPU + \eta(x \otimes \delta)$$

where RPU represents the resistance values of the second array 304, $\eta$ is a learning rate, x is a vector selecting a particular column of the array, $\delta$ is the determined difference between the outputs for a respective column of the arrays, and $\otimes$ is the Kronecker product. When $\eta$ is large, weights are adjusted in relatively large steps. The value of $\eta$ can change during a copying process, with initial values of $\eta$ being large and lower values being used later to aid in convergence.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
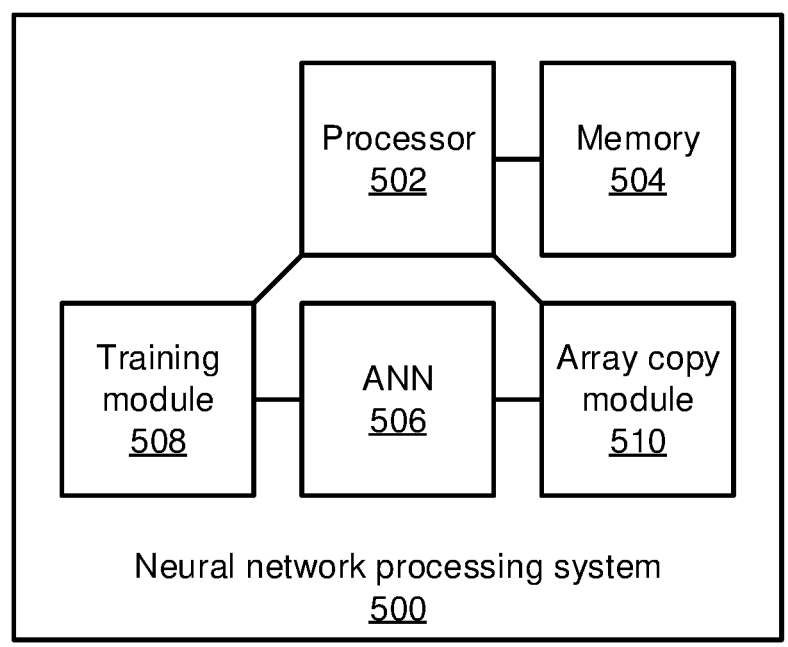
FIG. 5 is a block diagram of a neural network processing system that copies values from a first array of resistive processing units to a second array of resistive processing units that is not sensitive to device variation or circuit parasitics.

Referring now to FIG. 5, a neural network processing system 500 is shown. The system 500 includes a hardware processor 502 and a memory 504. An ANN 506 is implemented in a hardware embodiment where the weights 204 are implemented as respective RPUs. The ANN 506 can include multiple arrays of such weights 204 and any arrangement of weights and neuron layers that is appropriate to an application in question. In some embodiments, the system 500 can have multiple ANNs 506. The system 500 further includes one or more functional modules that, in some embodiments, can be implemented as software that is stored in the memory 504 and that is executed by the processor 502. In other embodiments, one or more of the modules can be implemented as one or more discrete hardware components in the form of, e.g., application specific integrated chips or field programmable gate arrays.

A training module 508 operates to train the values of the weights in the ANN 506 according to a set of training data. The trained weights make the ANN 506 capable of performing its designed function with accuracy. An array copy module 510 operates to copy the weights from a first array of weights in the ANN 506 to another array in the same ANN 506 or to an array in a distinct ANN 506.

Figure 6:
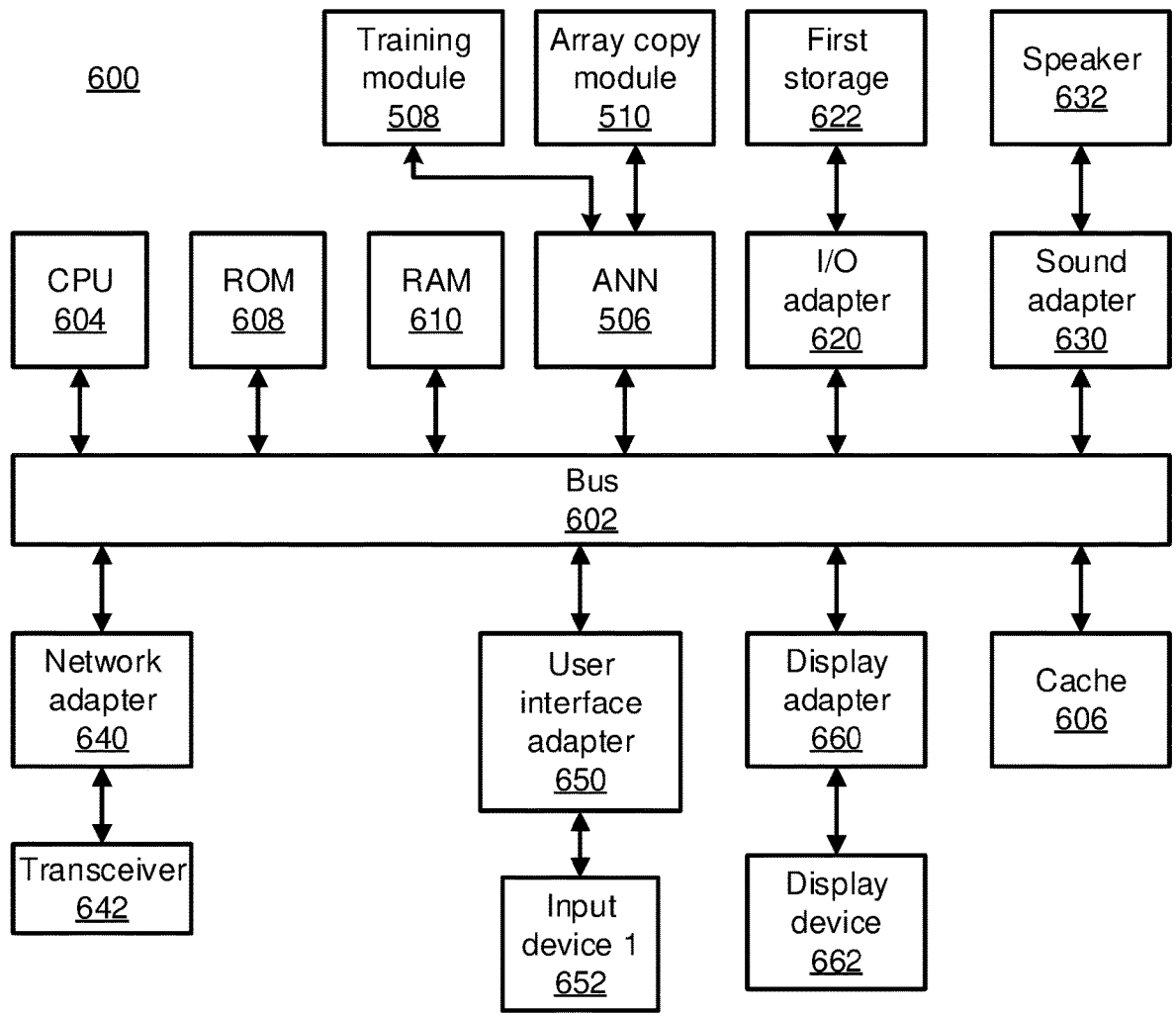
FIG. 6 is a block diagram of a processing system that includes a neural network processing system that copies values from a first array of resistive processing units to a second array of resistive processing units that is not sensitive to device variation or circuit parasitics.

Referring now to FIG. 6, an exemplary processing system 600 is shown which may represent the neural network processing system 500. The processing system 600 includes at least one processor (CPU) 604 operatively coupled to other components via a system bus 602. A cache 606, a Read Only Memory (ROM) 608, a Random Access Memory (RAM) 610, an input/output (I/O) adapter 620, a sound adapter 630, a network adapter 640, a user interface adapter 650, and a display adapter 660, are operatively coupled to the system bus 602.

A first storage device 622 is operatively coupled to system bus 602 by the I/O adapter 620. The storage device 622 can be any of a disk storage device (e.g., a magnetic or optical disk storage device), a solid state magnetic device, and so forth. The storage device 622 can be the same type of storage device or different types of storage devices.

A speaker 632 is operatively coupled to system bus 602 by the sound adapter 630. A transceiver 642 is operatively coupled to system bus 602 by network adapter 640. A display device 662 is operatively coupled to system bus 602 by display adapter 660.

A first user input device 652 is operatively coupled to system bus 602 by user interface adapter 650. The user input device 652 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input device 622 can be the same type of user input device or different types of user input devices. The user input device 652 is used to input and output information to and from system 600.

Of course, the processing system 600 may also include other elements (not shown), as readily contemplated by one of skill in the art, as well as omit certain elements. For example, various other input devices and/or output devices can be included in processing system 600, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 600 are readily contemplated by one of ordinary skill in the art given the teachings of the present principles provided herein.

The artificial neural network 506 interfaces with the bus 602 and communicates with training module 508 and array copy module 510. The neural network 506 includes multiple hardware arrays that can have their values copied to other hardware arrays using the array copy module 510 using the process described herein.

Having described preferred embodiments of copying weights between resistive cross-point arrays (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for copying weight values between weight arrays, comprising:
reading outputs from a first array;
reading outputs from a second array;
determining differences between respective outputs of the first array and the second array using a processor; and
adjusting values of the second array in accordance with the determined differences.

2. The method of claim 1, wherein the first array and the second array are implemented as resistive cross-point arrays, each comprising a plurality of weights implemented as respective resistive processing units.

3. The method of claim 1, further comprising repeating the steps of reading outputs from the second array, determining differences, and adjusting values of the second array to iteratively decrease the differences between the outputs from the first array and the outputs from the second array.

4. The method of claim 3, wherein said repeating is performed until the differences are below a threshold value.

5. The method of claim 3, wherein said repeating is performed until a maximum number of iterations has been reached.

6. The method of claim 1, further comprising initializing the values of the second array before reading the values of the second array.

7. The method of claim 6, wherein initializing the values of the second array comprises setting the values of the second array to equal the values of the first array, without accounting for device variation and circuit parasitics.

8. A method for copying weight values between weight arrays, comprising:
reading outputs from a first array that comprises a first plurality of weights implemented as respective resistive processing units;
reading outputs from a second array that comprises a second plurality of weights implemented as respective resistive processing units;
determining differences between respective outputs of the first array and the second array using a processor;
adjusting values of the second array in accordance with the determined differences; and
repeating the steps of reading outputs from the second array, determining differences, and adjusting values of the second array to iteratively decrease the differences between the outputs from the first array and the outputs from the second array.

9. The method of claim 8, wherein said repeating is performed until the differences are below a threshold value.

10. The method of claim 8, wherein said repeating is performed until a maximum number of iterations has been reached.

11. The method of claim 8, further comprising initializing the values of the second array before reading the values of the second array.

12. The method of claim 11, wherein initializing the values of the second array comprises setting the values of the second array to equal the values of the first array, without accounting for device variation and circuit parasitics.

13. A resistive processing unit (RPU) system, comprising:
a first array of RPUs;
a second array of RPUs; and
an array copy module configured to reading outputs from the first array, to read outputs from the second array, to determine differences between respective outputs of the first array and the second array, and to adjust values of the second array in accordance with the determined differences.

14. The system of claim 13, wherein the array copy module is further configured to repeat the reading of outputs from the second array, the determination of differences, and the adjustment values of the second array to iteratively decrease the differences between the outputs from the first array and the outputs from the second array.

15. The system of claim 14, wherein the array copy module is further configured to continue repeating until the differences are below a threshold value.

16. The system of claim 14, wherein the array copy module is further configured to continue repeating until a maximum number of iterations has been reached.

17. The system of claim 13, wherein the array copy module is further configured to initialize the values of the second array before reading the values of the second array.

18. The system of claim 17, wherein the array copy module is further configured to set the values of the second array to equal the values of the first array, without accounting for device variation and circuit parasitics, to initialize the values of the second array.

19. The system of claim 13, wherein the first array and the second array are parts of different respective neural networks.

20. The system of claim 13, wherein the first array and the second array are parts of a same neural network.

* * * * *